(12) United States Patent
Ishida

(10) Patent No.: US 7,384,176 B2
(45) Date of Patent: Jun. 10, 2008

(54) VEHICULAR HEADLAMP EMPLOYING SEMICONDUCTOR LIGHT SOURCE

(75) Inventor: Hiroyuki Ishida, Shizuoka (JP)

(73) Assignee: Koito Manufacturing Co., Ltd., Tokyo (JP)

(*) Notice: Subject to any disclaimer, the term of this patent is extended or adjusted under 35 U.S.C. 154(b) by 535 days.

(21) Appl. No.: 10/698,939

(22) Filed: Nov. 3, 2003

(65) Prior Publication Data

US 2004/0136197 A1 Jul. 15, 2004

(30) Foreign Application Priority Data

Nov. 6, 2002 (JP) .......................... P.2002-322653

(51) Int. Cl.
*B60Q 1/04* (2006.01)
*B60Q 1/00* (2006.01)

(52) U.S. Cl. .................. 362/545; 362/543; 362/544

(58) Field of Classification Search ................ 362/211, 362/212, 214, 508, 539, 543, 544, 545, 800, 362/251
See application file for complete search history.

(56) References Cited

U.S. PATENT DOCUMENTS

| | | | |
|---|---|---|---|
| 5,567,036 A * | 10/1996 | Theobald et al. | 362/800 |
| 6,184,628 B1 * | 2/2001 | Ruthenberg | 362/800 |
| 6,520,669 B1 * | 2/2003 | Chen et al. | 362/545 |
| 6,565,247 B2 | 5/2003 | Thominet | |
| 6,890,086 B2 * | 5/2005 | Shiu | 362/251 |
| 6,897,771 B1 * | 5/2005 | Lodhie et al. | 362/545 |
| 2001/0019486 A1 | 9/2001 | Thominet | |
| 2004/0042212 A1 * | 3/2004 | Du et al. | 362/296 |
| 2004/0056265 A1 | 3/2004 | Arndt et al. | |

FOREIGN PATENT DOCUMENTS

| | | |
|---|---|---|
| EP | 1 270 324 A2 | 6/2002 |
| GB | 521268 | 5/1940 |
| JP | 2001-266620 | 9/2001 |
| JP | 2001-266620 A | 9/2001 |
| JP | 2003031007 | 1/2003 |
| WO | WO 01/01038 A1 | 1/2001 |
| WO | WO 02/17401 A1 | 2/2002 |

* cited by examiner

*Primary Examiner*—Y. My Quach-Lee
(74) *Attorney, Agent, or Firm*—Sughrue Mion, PLLC

(57) ABSTRACT

A vehicular headlamp employing a semiconductor light-emitting device having a plurality of light-emitting elements such as LEDs and for which light distribution design is made easy. Separate ones of the light-emitting elements within the light-emitting device are employed for forming high and low headlamp beams. The light-emitting device also includes a reflector and a lens. The beams are switched by selectively activating predetermined ones of the light-emitting elements.

12 Claims, 9 Drawing Sheets

VEHICULAR HEADLAMP EMPLOYING SEMICONDUCTOR LIGHT SOURCE

CROSS-REFERENCE TO RELATED APPLICATIONS

Not applicable

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not applicable

BACKGROUND OF THE INVENTION

The present invention relates to a vehicular headlamp of a type employing a semiconductor light-emitting device incorporating a plurality of light-emitting elements as a light source, and in which different illuminating functions with different beams can be achieved by selectively activating the various semiconductor light-emitting elements.

Most commonly, an incandescent bulb or a discharge bulb has conventionally been used as a light source of a vehicular headlamp. However, more recently semiconductor light-emitting elements such as light-emitting diodes (LEDs) have been employed in order to achieve lower electric power consumption and a more compact size.

Examples of lamps using LEDs include high-mount stop lamps, rear side marker lamps, and the like.

When semiconductor light-emitting elements such as LEDs are used as a light source of a vehicular headlamp, special optical design techniques are required in order to create a suitable light distribution pattern for a low-beam. For example, as disclosed in Japanese Patent Application Laid-Open No. 2001-266620 (FIGS. 1 and 4), in order to implement multiple optical functions, switching is carried out using a large number of semiconductor light sources arranged in a matrix configuration.

Since switching between a low beam and a high beam is necessary in a vehicular headlamp, in a headlamp employing a plurality of semiconductor light-emitting elements the light-emitting elements to be activated must be selected in accordance with the type of beam to be emitted. However, since conventionally known semiconductor light-emitting elements have not been designed taking into consideration the required light distribution patterns for a vehicle, there are various problems in optical design which occur when using such elements as a light source. For example, for a low-beam light distribution pattern it is difficult to clearly form a cut line (cut-off line) defining a contrast boundary. In addition, use of a large number of light-emitting elements causes a problem in that the total space occupied by the light-emitting elements is large.

BRIEF SUMMARY OF THE INVENTION

Therefore, it is an object of the present invention to provide a vehicular headlamp capable of providing desired light distribution patterns and which uses semiconductor light-emitting elements such as LEDs as a light source.

According to the present invention, a vehicular headlamp is provided with a semiconductor light-emitting device as a light source and an optical system including at least one of a reflector and a lens, wherein the light-emitting device is provided with one or a plurality of light-emitting elements for forming a first beam and one or a plurality of light-emitting elements for forming a second beam, wherein the beams are switched by selectively activating the light-emitting elements for the first and second beams.

Consequently, according to the present invention, good light distribution patterns for both beams are obtained by switching the various light-emitting elements within the light-emitting device in accordance with the type of the beam to be supplied.

BRIEF DESCRIPTION OF THE SEVERAL VIEWS OF THE DRAWINGS

FIG. 7, FIG. 8 and FIG. 9 show an example of a light-emitting device used in the practice of the present invention, of which FIG. 7 shows the light-emitting device viewed in the direction of its optical axis, FIG. 8 is an explanatory view showing the relative positional relationship between light-emitting elements within the light-emitting device, and FIG. 9 is a schematic perspective view of the light-emitting device.

DETAILED DESCRIPTION OF THE INVENTION

The present invention relates to a vehicular headlamp having as a light source a semiconductor light-emitting device employing one or more semiconductor light-emitting elements. The invention is applicable to headlamps, fog lamps, and the like. The semiconductor light-emitting element may, for example, be an LED that emits light in response to an electric current flowing through a pn junction in the forward direction or an EL element that emits light in response to an applied electric field.

Figure 1:
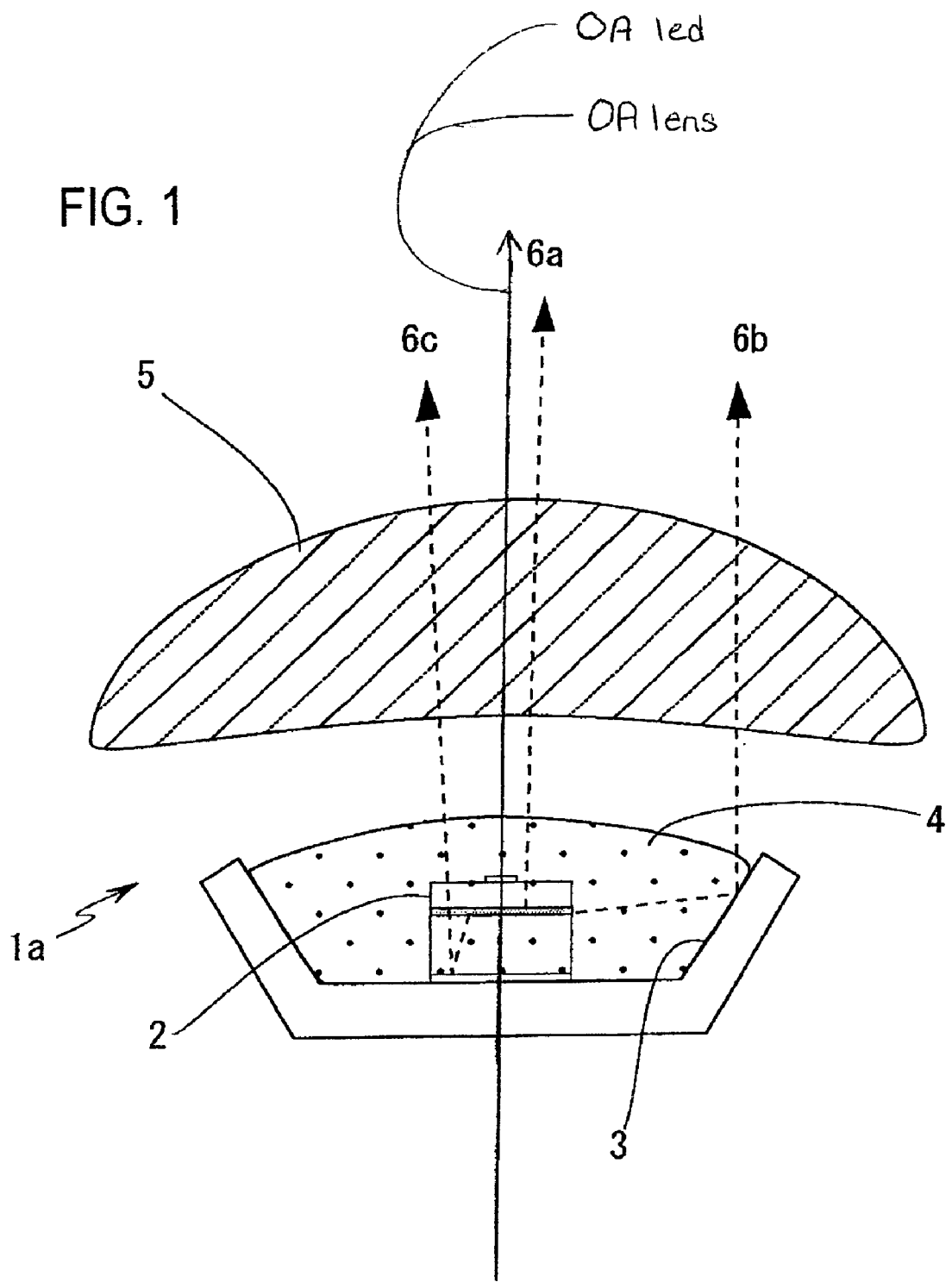
FIG. 1 is an explanatory view showing an example of semiconductor light-emitting device of a type used in the practice of the invention.

FIG. 1 schematically shows the structure of an LED as an example.

A light-emitting device 1 includes a semiconductor chip 2, a reflector 3, a fluorescent body 4, and a lens 5. In this example, a light-emitting element 1a includes the semiconductor chip 2, the reflector 3, and the fluorescent body 4. Further, the light-emitting device 1 has an optical axis "$OA_{led}$" and the lens 5 has an optical axis "$OA_{lens}$."

The semiconductor chip 2 is made of Al—In—Ga—P system material, In—Ga—N system material, or the like. As shown in the drawing, the semiconductor chip 2 can be directly mounted on a supporting member (lead frame, stem, or the like), or it can be mounted on a sub-mount member and the sub-mount member then mounted on the supporting member. Bonding wires (not shown in the drawing) are connected to electrodes provided on the semiconductor chip 2.

The reflector 3 is positioned around the semiconductor chip 2. The supporting structure for the semiconductor chip 2 may have a cup-shaped portion having a concave face forming a reflecting surface. Light emitted by the semiconductor chip 2 has an intensity distribution centered on the optical axis of the light-emitting device. Hence, the further a point is angularly from the optical axis, the less the light intensity. Therefore, as shown in the drawing, between the direct light 6a and reflected light 6b and 6c, the direct light in the optical axis direction is of greater intensity. However, the reflector 3 is provided to effectively use light emitted toward the sides of the semiconductor chip such as the light 6b. That is, light is reflected from a reflecting surface of the reflector 3 and thereby directed forward (in an illumination direction). The light 6c is, after being emitted from a lower light-emitting layer of the semiconductor material, directed in the direction opposite to the illumination direction. The light 6c is then directed forward upon being reflected from the lower, rear end surface of the semiconductor chip 2. Alternatively, the light 6c can be radiated from a side surface of the semiconductor chip 2 and reflected by the reflector 3 after being reflected from the rear surface of the semiconductor chip 2.

The fluorescent body 4 covers the semiconductor chip 2 and the surrounding space. It is possible to obtain white light by, for example, mixing blue light emitted from a semiconductor chip and yellow light emitted from a material such as a YAG fluorescent body.

The lens portion can be arranged forward of the semiconductor chip 2, or otherwise the light-emitting element 1a can be enveloped in a plastic lens. In the latter case, the orientation characteristic is improved if the entire light-emitting element is enveloped in the plastic material. For example, a bullet-shaped lens portion can be used in a stop lamp or the like. A lens having a dome or hemispherical shape is preferable to prevent light emitted over a wide angle from the semiconductor chip 2 from being reflected inside the lens, and also to prevent light emitted from the sides of the lens from being lost. Generally, it is preferable that light is more efficiently used by gathering light emitted from the semiconductor chip by effective light path control using reflecting surfaces as necessary.

When a light source image of the light-emitting device has a circular shape when viewed in the direction of the optical axis of the light-emitting device, most of the light emitted from the light-emitting device is direct light which contributes to formation of a circular illuminating pattern. Further, a ring pattern located around the circular pattern is formed by light emitted from the sides of the lens portion, thereby acting as a pseudo light source.

Thus, if the intensity distribution of the light source is rotationally symmetric around the optical axis, since it is necessary to form a rotationally asymmetric light distribution pattern based on the substantially circular pattern when viewed in the direction of the optical axis, optical design becomes difficult. For instance, it is difficult to form a straight portion such as a cut line in a low-beam light distribution pattern since merely connecting arc portions cannot form a clear straight portion.

Therefore, in a case where the light intensity distribution of the light-emitting device is rotationally asymmetric around the optical axis, the light-element is formed in a horizontally elongated shape in a direction orthogonal to the optical axis of the light-emitting element so that the projected image through the optical system has a pattern shape with a straight portion.

Figure 2:
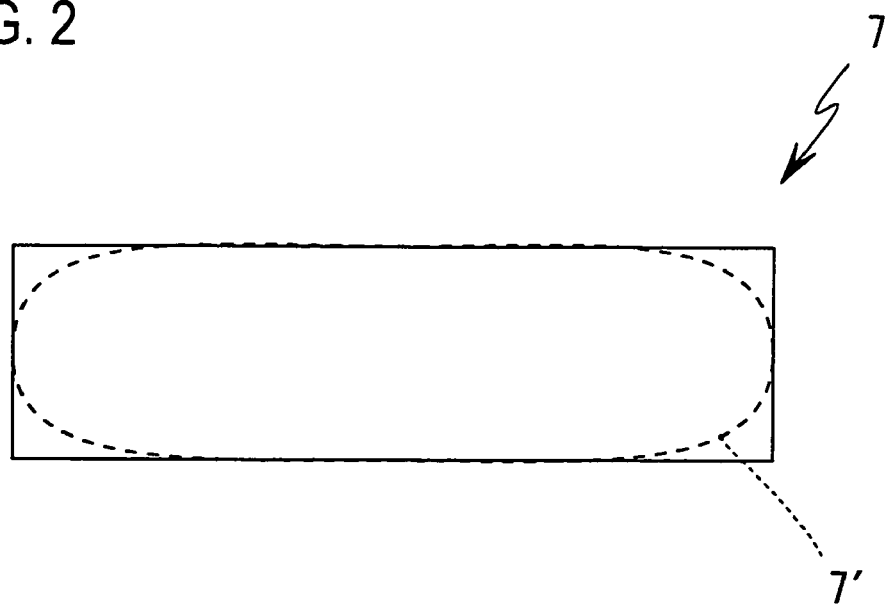
FIG. 2 shows an example of the rectangular shape of a light-emitting element used in the light-emitting device of FIG. 1.

FIG. 2 schematically shows an example of the pattern shape of a light source image of the light-emitting device when viewed in the direction of the optical axis of the light-emitting device.

Specifically, FIG. 2 shows an example of the pattern shape of a light source image 7 where the side edge portion thereof has a substantially rectangular shape.

In this example, the shape of the light-emitting element 1a when viewed in the direction of the optical axis is rectangular, and the light source image is enlarged mainly in the longitudinal direction, as described below.

To obtain a horizontally elongated projection pattern, it is preferable to use a rectangular light source image rather than a square one. Since the shape of the light source image is not restricted to one where the end portion in the longitudinal direction is straight, a shape where the four corners are rounded, as in the light source image shown by a dashed line 7', is also possible.

To obtain a light source image as described above, the semiconductor chip, the reflector, the fluorescent body, or the lens portion of the light-emitting device are designed to have a shape which is rotationally asymmetric around the optical axis of the light-emitting device. In other words, the factors which determine the pattern shape of the light source image are the shape of the semiconductor chip, the shapes of the reflector or the fluorescent body, the shape and the material of the lens, and the optical and positional relationship among these components. It is possible to design a light-emitting device that produces a desired light source image based on simulation results using a combination of techniques such as light ray tracing and light intensity distribution analysis.

The shape of the light-emitting element is mainly determined by the outer edge of the semiconductor chip and the outer peripheral edge of the reflector or the fluorescent body, and a large variation in the dimensional tolerances of these parameters negatively affects the light distribution design. It is preferable that the external dimensional tolerance not be more than 0.1 mm (millimeters).

Figure 3:
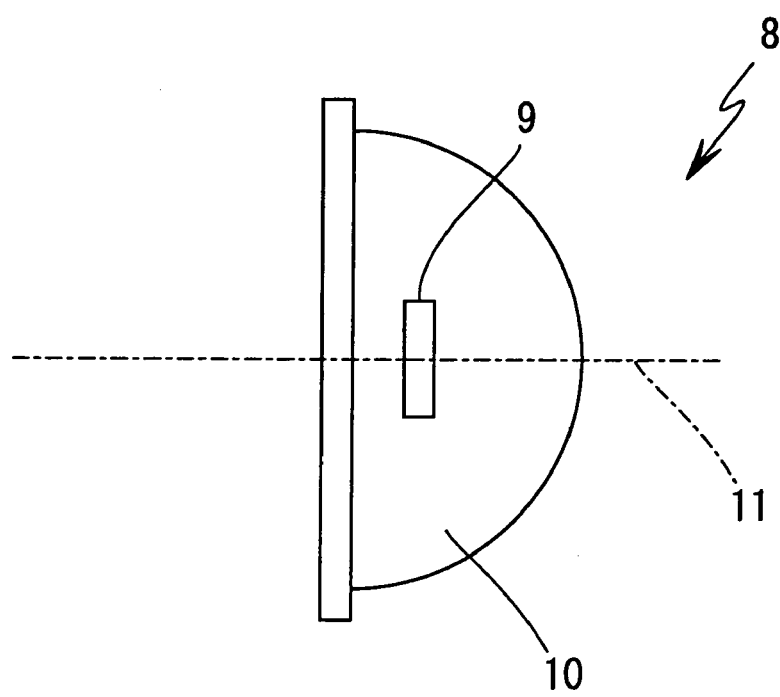
FIG. 3 is an explanatory side view of an LED device.

In a structure in which the semiconductor chip of the light-emitting element when viewed in the direction of the optical axis has a desired shape and the semiconductor chip is covered by a semi-cylindrical plastic lens (molded lens), when selecting the shape of the reflector or the fluorescent body technical difficulties and disadvantages in manufacturing costs or the like involved in designing the semiconductor chip to a particular shape should be taken into consideration. Generally, the desired light intensity should be achieved without significantly changing the shape of the semiconductor chip or the orientation characteristics thereof As shown in FIG. 3, a common LED 8 is structured such that the center of the semiconductor chip 9 thereof is positioned on the center axis 11 of a plastic lens 10. However, this design may cause various problems in the headlamp light distribution.

For example, the center axis 11 of the plastic lens 10 is generally orthogonal to the optical axis of the associated optical system, and light from the LED 8 is reflected forward (in a radiation direction) using a reflector such that light for forming a low-beam light distribution is produced. In this case, light generated in peripheral portions of the semiconductor chip 9 is difficult to control because the distance from the center axis 11 is large.

Consequently, a side edge of the light-emitting element of the light-emitting device, when viewed in the direction of the optical axis, is formed so as to have a straight shape along one of the sides thereof. The position of this side edge of the light-emitting element is determined so as to intersect with the center axis of the lens portion.

Figure 4:
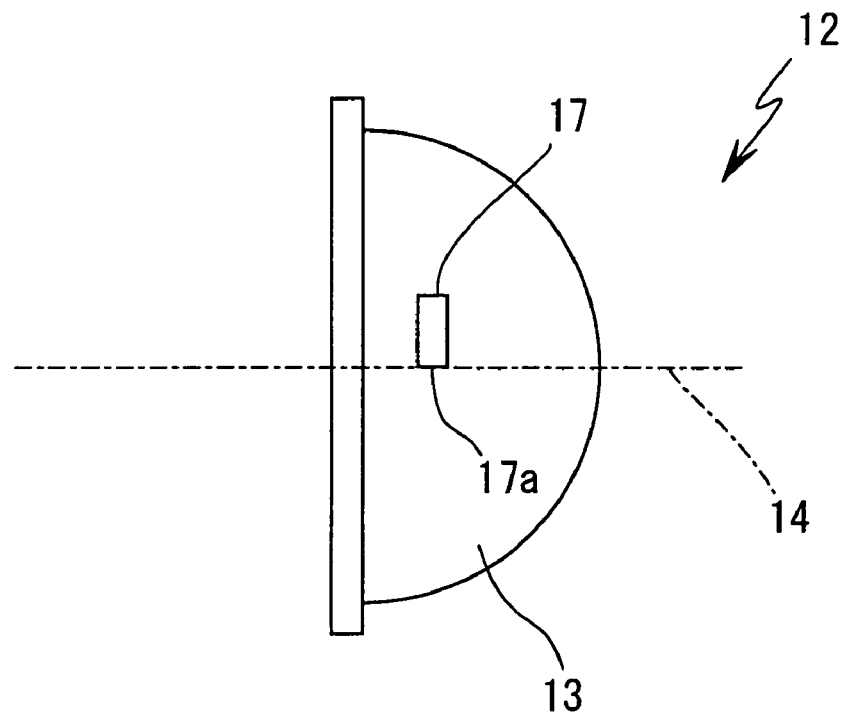
FIG. 4 shows a side view of an example of a light-emitting device used in the present invention.
Figure 5:
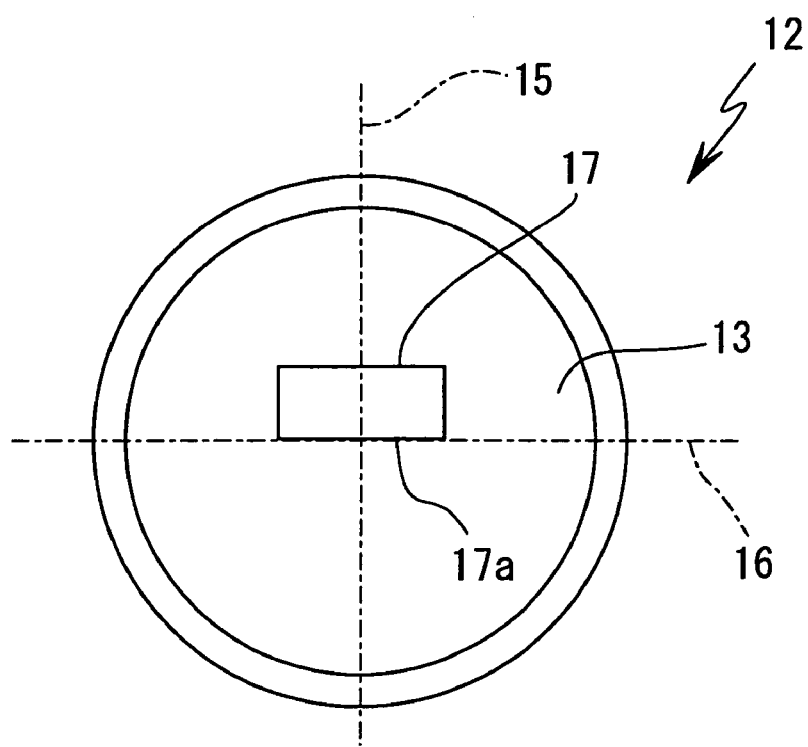
FIG. 5 is a view of the light-emitting device of FIG. 4 viewed in the direction of its optical axis.

FIG. 4 and FIG. 5 show an example of the structure of the light-emitting device 12, of which FIG. 4 is a side elevational view and FIG. 5 is a front elevational view.

In FIG. 4, the center axis 14 of the lens 13 of the light-emitting device 17 is indicated by a single-dashed line. In FIG. 5, a vertical axis 15, which is orthogonal to the center axis 14 and passes through the center of the light-emitting element 17, and a lateral axis 16, which is orthogonal to the vertical axis and which coincides with a long straight side 17a of the light-emitting element 17, are also indicated by single-dashed lines.

In this example, a light-emitting element 17 is rectangular when viewed from the front, and the long side 17a thereof is aligned with and orthogonal to the central portion 14 of the lens 13 and to the lateral axis 16. That is, since, in the light distribution of a headlamp the spread of the pattern in the up-down (vertical) direction is comparatively small while the spread of the pattern in the right-left (horizontal) direction is large, it is desirable to use a rectangular projection pattern.

Figure 6:
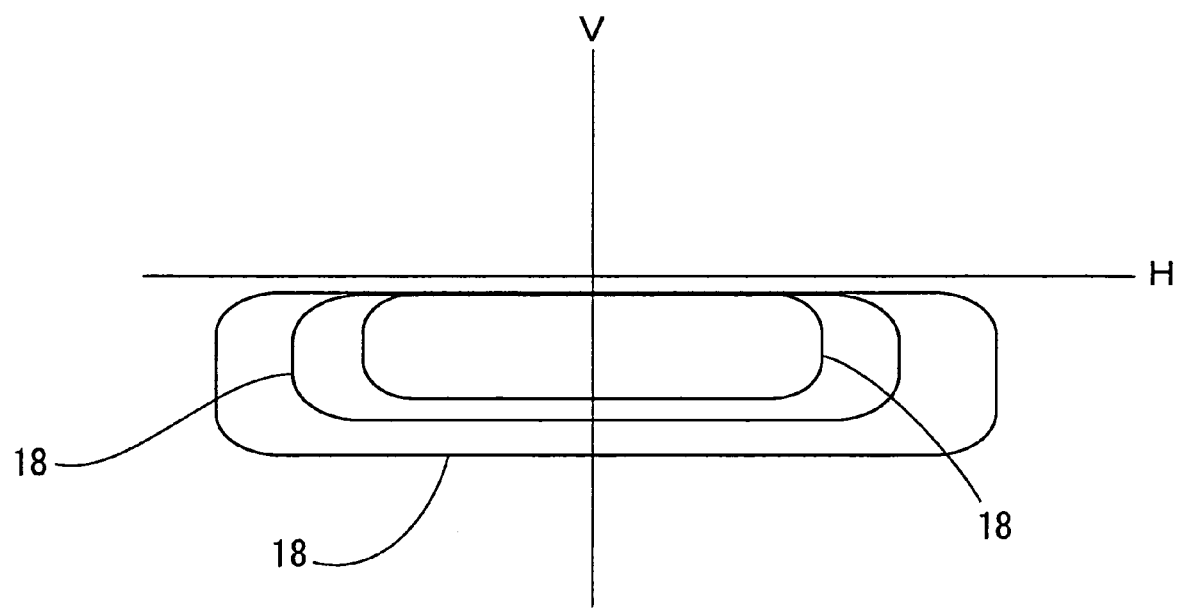
FIG. 6 is an explanatory view of a projected image from a light-emitting device of the invention.

FIG. 6 schematically shows a projection pattern produced by the light-emitting element 17, where a lateral axis H coincides with a horizontal line and a vertical axis V with a vertical line.

The light-emitting element 17 is made rectangular, which is easiest for forming the light-emitting element in a horizontally elongated shape. In addition, an arrangement is employed in which the light-emitting element 17 is placed closer to one side of a surface which includes the center axis 14 and the axis 16 such that a longer side 17a thereof intersects with the center axis 14 of the lens portion 13. Accordingly, one of the sides (which corresponds to the longer side 17a) of each of the projected images 18, which are generally rectangular, are aligned. When a screen is arranged in front of a lamp, with regard to a light ray which passes in the vicinity of the center axis of the lens 13, a horizontally elongated image with little distortion is projected on the screen, and therefore a clear cut line can be formed. Furthermore, by combining a plurality of projected images of such horizontally elongated shapes, a light distribution pattern required for a headlamp can be obtained. Therefore, since the light which is transmitted by the lens can be correctly controlled, it is possible to reduce the amount of light that causes glare.

The size of the projected image can be adjusted by setting the focal distance of the lens, or it can be adjusted by using an external diffusion lens.

According to the present invention, a light-emitting device includes a light-emitting element used for forming a first illuminating (radiation) beam and a light-emitting element used for forming a second illuminating beam. Other arrangement may be employed as long as the light distribution of two or more types of beam can be formed using different light-emitting elements within one light-emitting device. Examples of such structures include one in which different light-emitting elements are used for forming a high beam and a low beam, and one in which different light-emitting elements are used for a low beam and a turning (cornering) beam.

Moreover, since the number of the light-emitting elements used in the formation of each illuminating beam is not critical, one or a plurality of light-emitting elements may be used for each beam. It is possible to switch beams by selectively activating the light-emitting elements corresponding to each beam.

Figure 7:
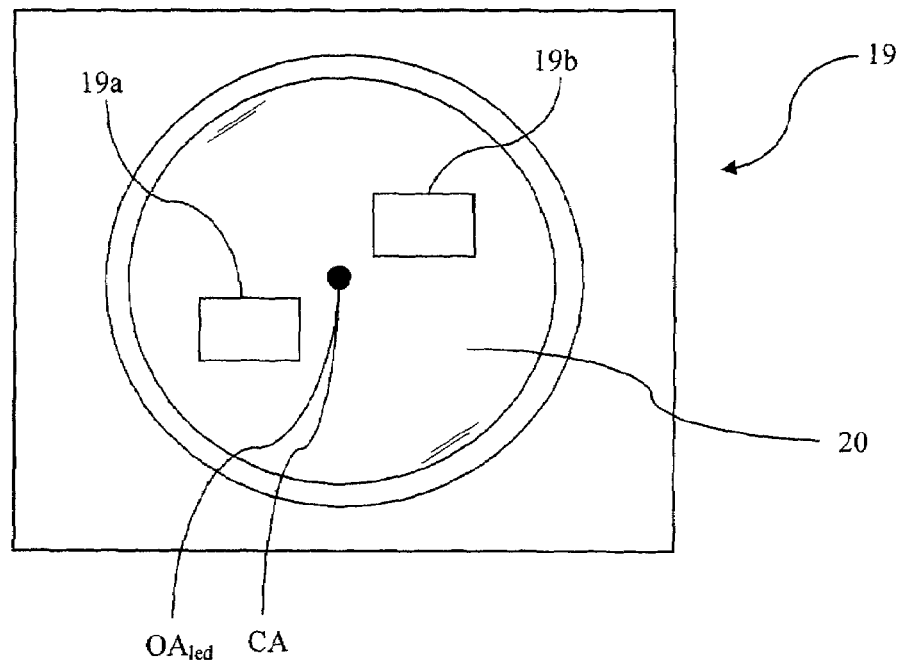
Figure 8:
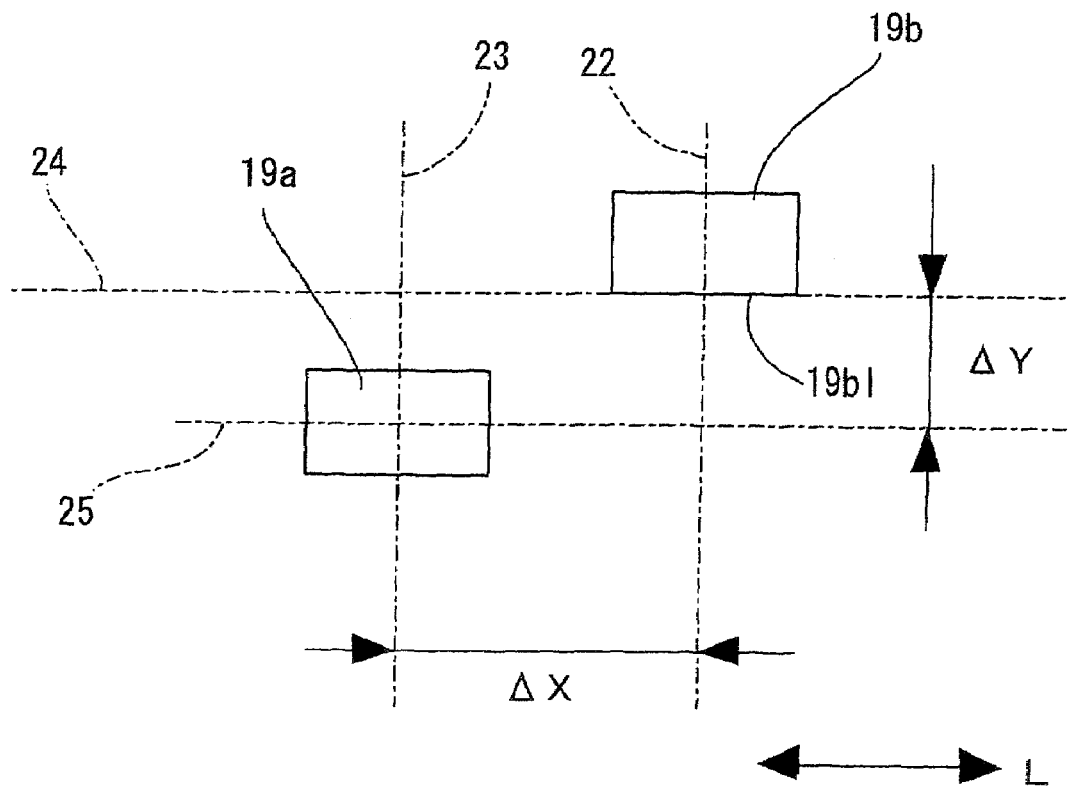
Figure 9:
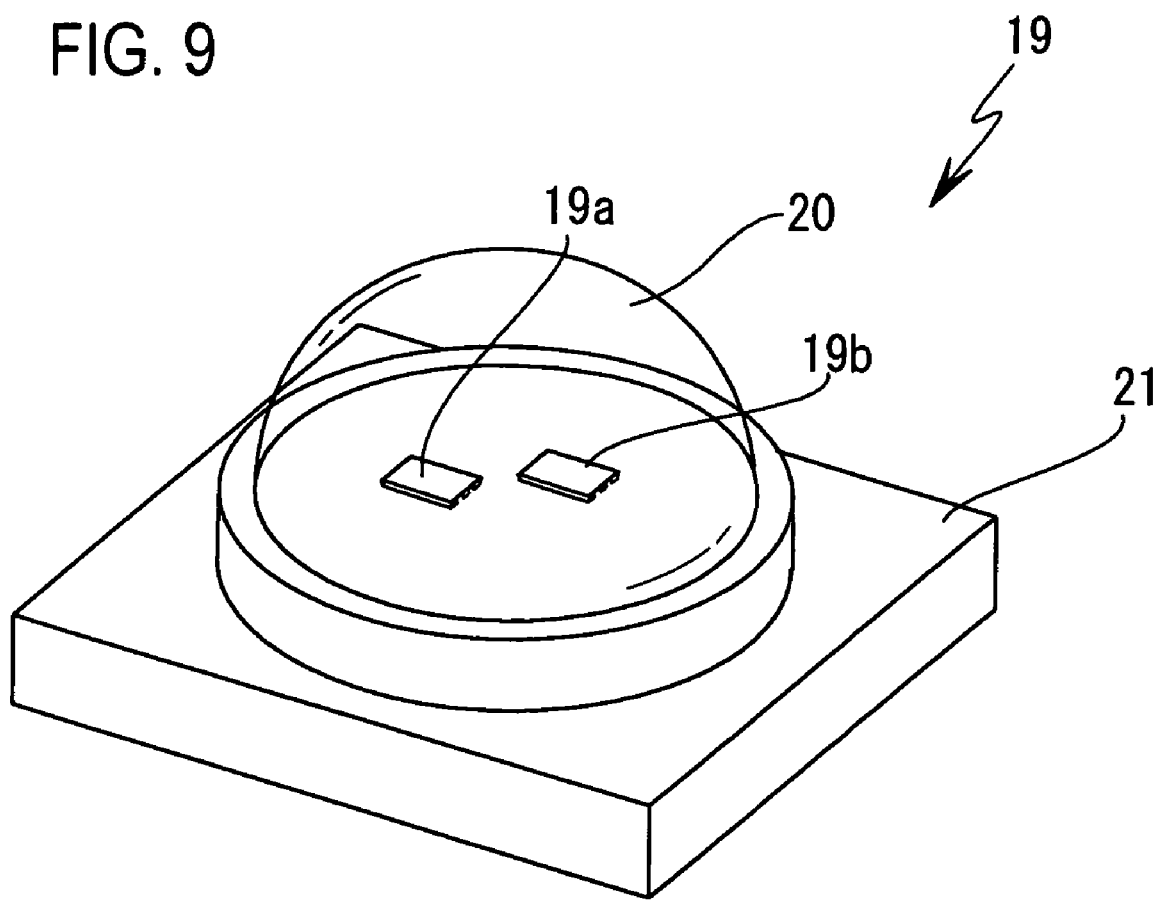

FIGS. 7 to 9 show an example of a structure of a light-emitting device 19 having a first light-emitting element 19a used for forming a high beam and a second light-emitting element 19b used for forming a low-beam. FIG. 7 is a view taken in a direction along the optical axis of the light-emitting device 19 in FIG. 7, FIG. 8 shows the positional relationship of the light-emitting elements, and FIG. 9 is a perspective view of the light-emitting device 19.

Concerning the positional relationship between the light-emitting element 19a and the light-emitting element 19b, as shown in FIG. 7 the second light-emitting element 19b is positioned upwards and the first light-emitting element 19a is positioned to the lower left thereof. It is to be noted that the semiconductor chips and the reflector constituting each light-emitting element has a horizontally elongated rectangular shape.

Further, a structure is provided wherein both light-emitting elements are covered with a substantially hemispherical transparent member 20 on a circuit board 21, or the transparent member 20 is disposed in front of the circuit board 21 on which the light-emitting elements are provided. Additionally, the light-emitting device 19 has an optical axis "$OA_{led}$" and the substantially hemispherical transparent member 20 has a center axis "CA".

In FIG. 8 only the light-emitting elements 19a and 19b are shown, and the relative positional relationship therebetween is depicted. The direction indicated by a double-headed arrow L corresponds to the direction of orientation of the optical axis of the light-emitting device. $\Delta X$ in the drawing indicates the distance between the centers of the light-emitting elements in a direction parallel to the optical axis of the lamp, that is, the distance between a vertical axis 22 passing through the center of the second light-emitting element 19b and extending in a direction orthogonal to the direction L and a vertical axis 23 passing through the center of the first light-emitting element 19a and extending in a direction orthogonal to the direction L. Further, $\Delta Y$ indicates the distance between a long side 19b1 of the light-emitting element 19b and the center of the light-emitting element 19a in a direction orthogonal to the radiation optical axis. In other words, $\Delta Y$ indicates the distance between a horizontal axis 24 including the long side 19b1 and extending in a direction parallel to the direction L and a horizontal axis 25 passing through the center of the first light-emitting element 19a and extending in a direction parallel to the direction L.

As shown in the drawing, the light-emitting elements 19a and 19b are longer in the direction L than in the direction orthogonal thereto. The light-emitting elements 19a and 19b are selectively switched in accordance with the beam to be generated.

With respect to the low-beam light distribution, the horizontal axis 24 including the long side 19b1 is taken as a data (reference) line for optical design in order to use light corresponding to the long side 19b1 and light in the vicinity thereof emanating from a light source image corresponding to the second light-emitting element 19b which contribute to the formation of a cut line portion in the light distribution pattern.

In order to obtain both a low-beam light distribution pattern and high-beam light distribution pattern using a single reflector, it is preferable for the first light-emitting element 19a to be disposed within a certain range taking the horizontal axis 24 as the data line. Specifically, as a practical matter $\Delta Y$ is desirably between 0.3 and 1.0 mm. In other words, of the two long sides of the second light-emitting element 19b, the center of the first light-emitting element is positioned on the horizontal axis 25 within a range $\Delta Y$ of 0.3 to 1.0 mm from the horizontal axis 24 including the long side 19b1 which is closer to the first light-emitting element 19b. It may be noted that optical design for obtaining a standard light distribution for a headlamp is difficult if $\Delta Y$ is outside this range.

Further, the distance between the centers of the two light-emitting elements in the direction L is preferably $\Delta X = 0.5$ to 1.5 mm. Accordingly, it is possible to direct the output beam in a specified direction when the high beam is turned on.

As described above, it is preferable for the light-emitting elements 19a and 19b to be disposed out of alignment both in the direction of the optical axis of the lamp and the direction orthogonal to this direction. Moreover, it is preferable to align the long side 19b1 of the second light-emitting element 19b accurately on the data axis (the horizontal axis 24) so as to facilitate formation of the cut line.

It should be noted that the positional relationship between the two light-emitting elements shown in FIGS. 7 to 9 applies to each of the two headlamps that are disposed at the right and the left of the front of the vehicle. In other words, with respect to the other headlamp, as apparent from the symmetry of the lamp structure around a vertical plane including the center axis of the vehicle, the positional relationship between the two light-emitting elements is reversed around the vertical plane, and thus the positional relationship is different from what is depicted in FIG. 8. Further, the numerical ranges of $\Delta X$ and $\Delta Y$ are independent of the sizes of the semiconductor chip and the like that constitute each of the light-emitting elements.

In a structure where a plurality of light-emitting elements are provided within a single light-emitting device, it is necessary to clearly define the contrast boundary between the light-emitting elements when selectively activating the individual light-emitting elements. For example, in a structure where one lens element is shared by a plurality of light-emitting elements, when selectively activating the light-emitting elements, light incident from each light-emitting element is transmitted. Alternatively, a problem arises when, for example, a lens which is intended to receive direct light from one light-emitting element receives light from other light-emitting elements. As a result, optical design becomes difficult and problems such as the generation of stray light arise.

Figure 10:
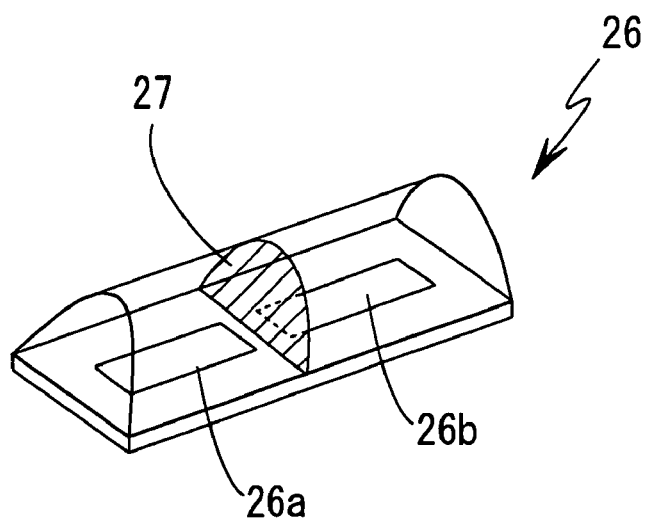
FIG. 10 is a perspective view showing separation of light-emitting elements by a light-shielding member.

In order to overcome such problems, for example, in a light-emitting device 26 as shown in FIG. 10, it is preferable that a light-shielding member 27 be provided as a partition between a light-emitting element 26a used for forming the first illuminating beam and a light-emitting element 26b used for forming the second illuminating beam. For the light-shielding member, a conventionally known material having not only low light transmittance but also desirable thermal conductivity is used.

Accordingly, it is possible to clearly define a light-emitting region when each light-emitting element is lit, and thus no light is incident on one light-emitting element from other light-emitting elements crossing a boundary portion with the adjacent region. Therefore, each region can be treated as an independent light source.

The aforementioned embodiment has been described with reference to an example in which one light-emitting element is provided for each beam. However, the invention is not limited to such an arrangement, and a structure in which two or more light-emitting elements are used per beam may be employed.

Figure 11:
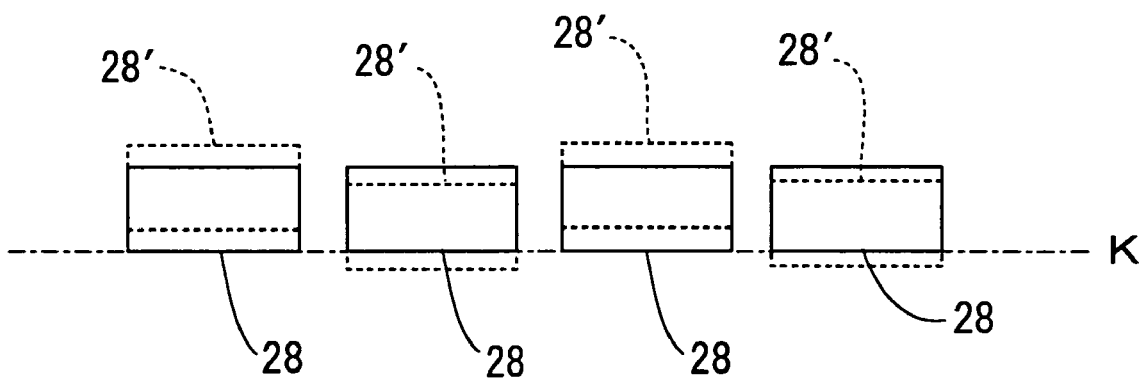
FIG. 11 is an explanatory view of a structure in which a plurality of light-emitting elements are arranged in a linear array.

For example, as shown in FIG. 11, in a structure in which a plurality of light-emitting elements are arranged for producing a low beam and the positional accuracy between the light-emitting elements is low, problems such as the projected image not being aligned and failure to form a cut line clearly arise.

In FIG. 11, a straight line K shown as a single-dashed line indicates a data line for cut line formation. There is no problem if the sides of the light-emitting elements are aligned, such as light-emitting elements 28 shown by solid lines, with respect to the straight line K. However, it is difficult to appropriately control the light distribution if light-emitting elements 28' are arranged so as to be not aligned with respect to the straight line K, as shown in a magnified fashion by the dashed lines.

Therefore, the relative positional tolerance between a plurality of the light-emitting elements which are arranged in the same light-emitting device should preferably be prescribed so as to be not more than ±0.01 mm. Particularly, it is necessary to accurately align the side of each light-emitting element in a straight line in order to clearly form the cut line.

Figure 12:
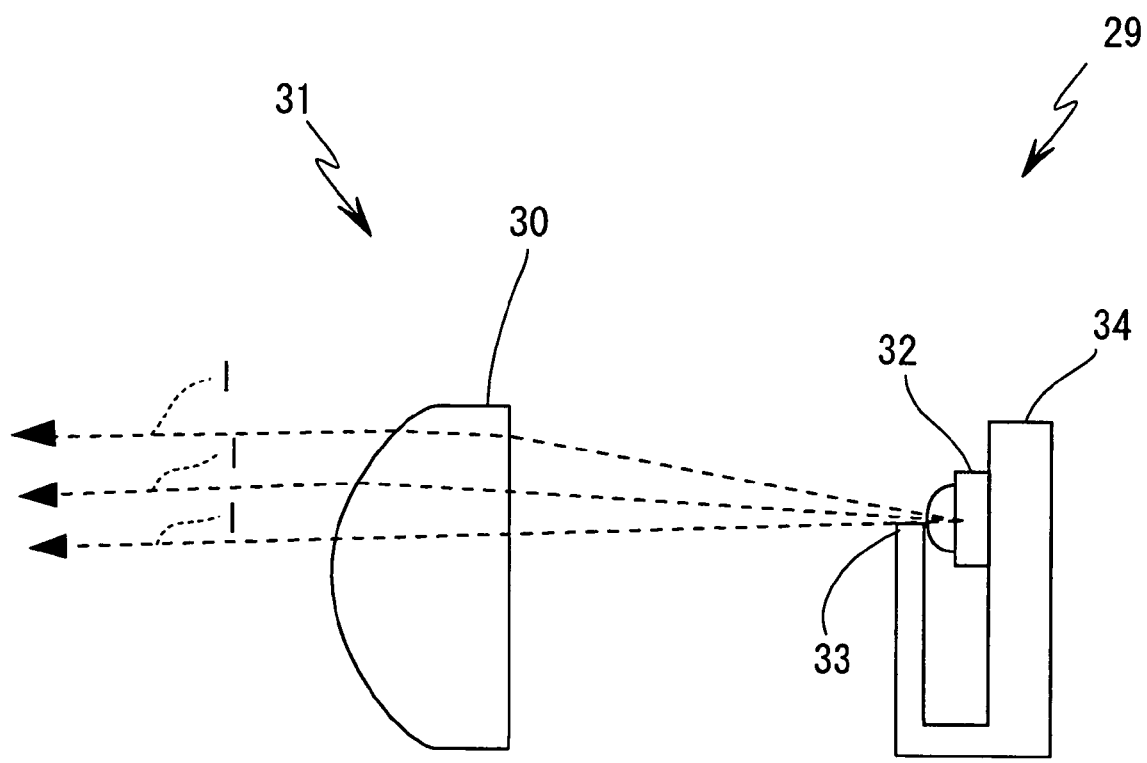
FIG. 12 shows schematically a headlamp constructed according to the present invention in which direct light from a semiconductor light-emitting device of the invention is employed to form the illuminating beams.
Figure 13:
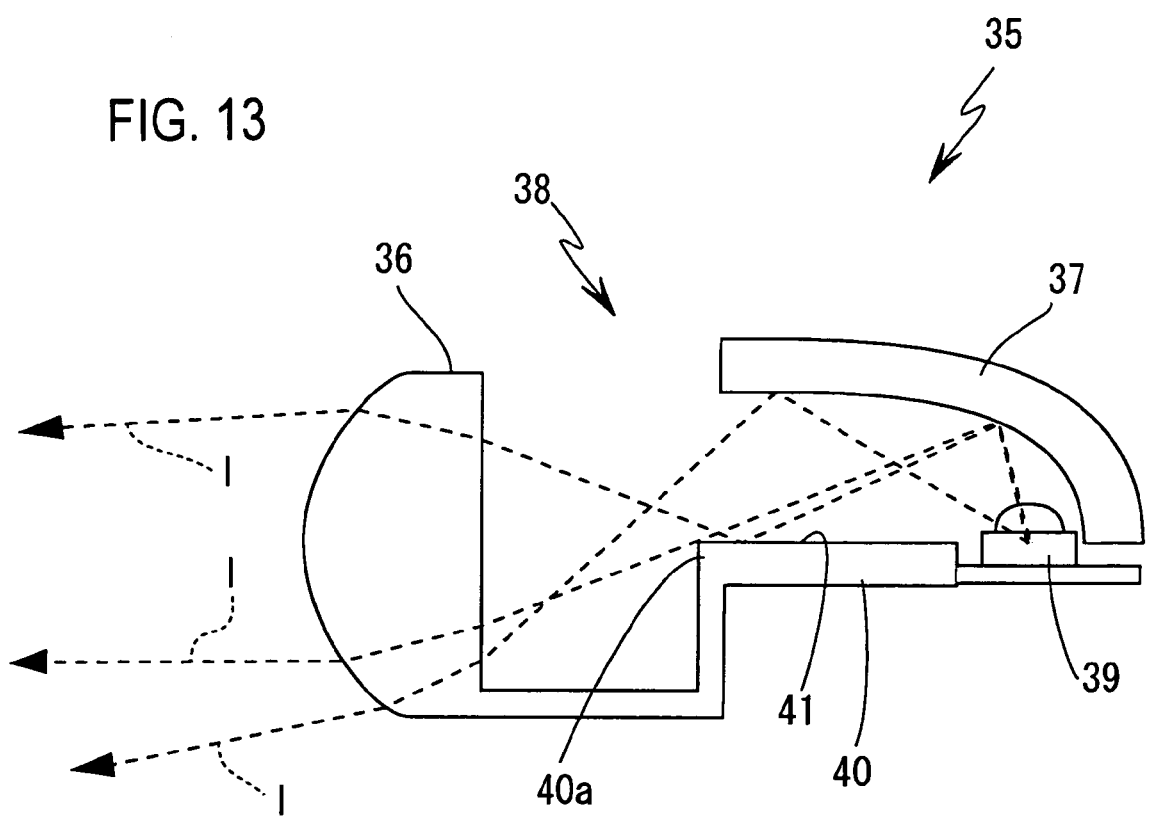
FIG. 13 is an explanatory view showing an example of a headlamp in which reflected light is used to form the illuminating beams.

FIGS. 12 and 13 show examples of structures of a vehicular headlamp constructed according to the present invention, particularly, a radiation portion. The structure uses a projection optical system having the following modes:

(A) a mode where direct light from the light-emitting device is mainly used (FIG. 12), and (B) a mode where light reflected by the reflector after being emitted from the light-emitting device is mainly used (FIG. 13).

In a vehicular lamp 29 as shown in FIG. 12, an optical system (a projection optical system) 31 including a projection lens 30 is used. That is, in this example, a structure is provided where a light-emitting device 32, a light-shielding member (shade) 33, and a projection lens 30 are provided, and the light-emitting device 32 and the light-shielding member 33 are mounted on a supporting member 34. Further, an object-side focal point of the projection lens 30 is set close to the upper edge of the light-shielding member 33. It is preferable to set the upper edge of the light-shielding member 33 as close to the light-emitting device 32 as possible for projecting the image formed by partly shielded light from the light-emitting device 32 at the upper edge of the light-shielding member 33.

The optical axes of the light-emitting device 32 and the lamp are parallel. Light emitted from the light-emitting device, namely, light which is not blocked by the light-shielding member 33 located forward of the light-emitting device, is directed forward as light 1 after passing through the projection lens 30. A cut line defining a contrast boundary in the light distribution pattern is formed by the upper end of the light-shielding member 33. Generally, the greater the radiation angle of the light emitted from the light-emitting device 32 the greater the amount of light that does not pass through the projection lens 30 and thus is lost for purposes of illumination. Therefore, it is necessary to determine the divergence angle taking the diameter of the projection lens and its location into consideration.

In a vehicular headlamp 35 as shown in FIG. 13, an optical system 38 including a projection lens 36 and a reflector 37 is used. That is, in this example the lamp is provided with a light-emitting device 39, the reflector 37, the projection lens 36, and a supporting member 40 for the light-emitting device 39. The projection lens 36 is formed in a crank shape when viewed from the side. A part of the supporting member serves as a light-shielding member 40a. The focal point of the reflector 37 is set at or in the vicinity of the light-emitting surface of the light-emitting element of the light-emitting device 39, and the object-side focal point of the projection lens 36 is set in the vicinity of the light-shielding member 40a. The shape of the reflecting surface can be a rotational ellipsoid, an ellipsoid-parabolic composite, or a free-form surface. In the latter case, the degree of freedom in design can be improved by employing a mathematical operation on the curved surface based on the base surfaces.

The light-emitting device 39 is mounted on the supporting member 40 such that the optical axis thereof is orthogonal to the optical axis of the lamp. Most of the light emitted by the light-emitting device 39 is reflected by the reflecting surface of the reflector 37. Light l directed forward, namely, light which is not blocked by the light-shielding member 40a, passes through the projection lens 36 to become radiated light. A cut line defining a contrast boundary in the light distribution pattern is formed by the upper edge of the light-shielding member 40a. The light flux utility rate can be improved by providing a planar reflector 41 between the light-emitting device 39 and the light-shielding member 40a. It is possible to manufacture components of the optical system with greater accuracy with respect, for example, to the mounting position of the light-emitting device 39, the upper edge position of the light-shielding member 40a, and the focal point of the projection lens 36 by integrally forming the supporting member 40 and the projection lens 36 using a transparent material.

In the structure described above where two or more different light distribution patterns are switched by selectively activating light-emitting elements, the light distribution design and optical design can be carried out easily. Particularly, by employing preferred shapes and arrangements of the light-emitting elements and taking into consideration the desired high-beam and low-beam distribution patterns, optical components such as a reflector can be easily designed. Moreover, such a structure is preferable for saving space and reducing the size of the optical system including the light-emitting device.

As apparent from the above description, designing a suitable optical system becomes easy by activating selected light-emitting elements within the light-emitting device in accordance with the beam pattern to be produced.

Thus, projection patterns appropriate for high-beam light distribution and low-light distribution for a vehicular headlamp can be obtained easily.

Moreover, it is possible to form a clear cut line in the low-beam light distribution easily with the use of the invention.

Furthermore, it is possible to reduce the restrictions on the optical design of the reflector or the like by specifying relative positions of the two light-emitting elements within a certain range. Therefore, for example, suitable high- and low-beam light distribution patterns can be obtained easily using the same reflector.

Still further, the two light-emitting elements can be optically separated such that light from one region is prevented from being incident on the other light-emitting region by providing a light-shielding member at a boundary region of the light-emitting elements.

It should further be apparent to those skilled in the art that various changes in form and detail of the invention as shown and described above may be made. It is intended that such changes be included within the spirit and scope of the claims appended hereto.

What is claimed is:

1. A vehicular headlamp comprising:
    an optical system comprising at least one of a reflector and a lens; and
    a semiconductor light-emitting device comprising at least one semiconductor light-emitting element for forming a first illuminating beam and at least one semiconductor light-emitting element for forming a second illuminating beam, wherein:
    said illuminating beams are switchable by selectively activating selected ones of said light-emitting elements for forming said first and second illuminating beams;
    said first illuminating beam is a high beam and said second illuminating beam is a low beam;
    each of said light-emitting elements has a horizontally elongated shape, extending in a horizontal direction orthogonal to an optical axis of said light-emitting device, and
    a light distribution pattern is formed by expanding a light source image of said light-emitting elements mainly in said horizontal direction with said optical system.

2. The vehicular headlamp according to claim 1, wherein:
    said light-emitting device comprises a device lens,
    said light-emitting elements for forming said high and low beams are each one in number;
    said light-emitting element for forming said high beam has a rectangular shape viewed in the direction of said optical axis of said light-emitting device; and
    a long side of said light-emitting element for forming said high beam intersects with and is orthogonal to a center axis of said device lens of said light-emitting device.

3. The vehicular headlamp according to claim 2, wherein a distance between one long side of the two long sides of said light-emitting element for forming said high beam which is closer to said light-emitting element for forming said low beam and a center of said light-emitting element for forming said low beam is in a range of 0.3 to 1 mm in a direction orthogonal to a direction of said optical axis of said light-emitting device.

4. A vehicular headlamp comprising:
    an optical system comprising at least one of a reflector and a lens; and
    a semiconductor light-emitting device comprising at least one semiconductor light-emitting element for forming a first illuminating beam and at least one semiconductor light-emitting element for forming a second illuminating beam, a base member on which said semiconductor light-emitting elements are mounted, and a device lens enveloping said light-emitting elements, wherein:

said illuminating beams are switchable by selectively activating selected ones of said light-emitting elements for forming said first and second illuminating beams; and each of said light-emitting elements is mounted at a position offset from an optical axis of said device lens.

5. The vehicular headlamp according to claim 4, wherein:

each of said light-emitting elements has a horizontally elongated shape, extending in a horizontal direction orthogonal to said optical axis of said device lens; and a light distribution pattern is formed by expanding a light source image of said light-emitting elements mainly in said horizontal direction with said optical system.

6. The vehicular headlamp according to claim 5, wherein:

said light-emitting elements for forming said first and second illuminating beams are each one in number;

said light-emitting element for forming said first illuminating beam comprising a high beam has a rectangular shape viewed in the direction of said optical axis of said device lens; and a long side of said light-emitting element for forming said high beam intersects with and is orthogonal to a center axis of said lens of said optical system.

7. The vehicular headlamp according to claim 6, wherein a distance between one long side of two long sides of said light-emitting element for forming said high beam which is closer to said light-emitting element for forming said second illuminating beam comprising a low beam and a center of said light-emitting element for forming said low beam is in a range of 0.3 to 1 mm in a direction orthogonal to a direction of said optical axis of said device lens.

8. A vehicular lamp according to claim 4, further comprising a light-shielding member provided between said at least one light-emitting element for forming said first beam and said at least one light-emitting element for forming said second beam.

9. A vehicular lamp according to claim 4, wherein the at least one semiconductor light-emitting element for forming the first illuminating beam and the at least one semiconductor light-emitting element for forming the second illuminating beam emit light along the optical axis.

10. A vehicular lamp according to claim 4, wherein:

the device lens covers, and is immediately adjacent to, the at least one semiconductor light-emitting element for forming the first illuminating beam and the at least one semiconductor light-emitting element for forming the second illuminating beam;

the optical axis of said device lens corresponds to a single optical axis for the semiconductor light-emitting device.

11. A vehicular lamp according to claim 4, wherein the semiconductor light-emitting device houses the at least one semiconductor light-emitting element for forming the first illuminating beam and the at least one semiconductor light-emitting element for forming the second illuminating beam within a single connected volume defined below the device lens.

12. A vehicular lamp according to claim 4, wherein the device lens is dome or hemispherically shaped.

* * * * *